(12) United States Patent
Secareanu et al.

(10) Patent No.: US 10,580,856 B2
(45) Date of Patent: Mar. 3, 2020

(54) STRUCTURE FOR IMPROVED NOISE SIGNAL ISOLATION

(71) Applicant: NXP USA, Inc., Austin, TX (US)

(72) Inventors: Radu Mircea Secareanu, Phoenix, AZ (US); Bernhard Grote, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 30 days.

(21) Appl. No.: 16/012,296

(22) Filed: Jun. 19, 2018

(65) Prior Publication Data

US 2019/0386098 A1 Dec. 19, 2019

(51) Int. Cl.
*H01L 29/66* (2006.01)
*H01L 29/06* (2006.01)
(Continued)

(52) U.S. Cl.
CPC ........ *H01L 29/0646* (2013.01); *H01L 21/761* (2013.01); *H01L 27/092* (2013.01); *H01L 29/66174* (2013.01); *H01L 29/66189* (2013.01)

(58) Field of Classification Search
CPC ........... H01L 29/0646; H01L 29/66174; H01L 29/66189
(Continued)

(56) References Cited

U.S. PATENT DOCUMENTS 6,909,150 B2 6/2005 Davis
7,511,346 B2 3/2009 Yeh
(Continued)

OTHER PUBLICATIONS

Chew, K. W. et al., "Impact of Deep N-well Implantation on Substrate Noise Coupling and RF Transistor Performance for Systems-on-a-Chip Integration"; Chartered Semiconductor Manufacturing Ltd., Mixed-Signal/RFCMOS Process Integration Group; 4 pages.
(Continued)

*Primary Examiner* — David Vu
*Assistant Examiner* — Brandon C Fox

(57) ABSTRACT

A structure for improved noise signal isolation in semiconductor devices. In one embodiment, the structure includes a second-conductivity type substrate, a $1^{st}$ first-conductivity type well, a $1^{st}$ first-conductivity type layer, a second-conductivity type layer positioned between the $1^{st}$ first-conductivity type well and the $1^{st}$ first-conductivity type layer. The structure also includes a $2^{nd}$ first-conductivity type well, and a $2^{nd}$ first-conductivity type layer positioned between the $2^{nd}$ first-conductivity type well and the $1^{st}$ first-conductivity type layer. The $1^{st}$ first-conductivity type layer and the second-conductivity type layer are positioned between the P type substrate and the $1^{st}$ first-conductivity type well, and the $1^{st}$ first-conductivity type well is laterally separated from the $2^{nd}$ first-conductivity type well.

19 Claims, 2 Drawing Sheets

(51) Int. Cl.
*H01L 27/092* (2006.01)
*H01L 21/761* (2006.01)
(58) Field of Classification Search
USPC .......................................... 257/427; 327/427
See application file for complete search history.

(56) References Cited

U.S. PATENT DOCUMENTS

| | | |
|---|---|---|
| 9,136,157 B1 | 9/2015 | Kar-Roy et al. |
| 2002/0184558 A1 | 12/2002 | Sessions |
| 2014/0061787 A1* | 3/2014 | Kim .................... H01L 29/36 257/339 |
| 2014/0225228 A1* | 8/2014 | Salcedo ............. H01L 27/0921 257/575 |
| 2014/0339601 A1* | 11/2014 | Salcedo ............. H01L 27/0262 257/140 |
| 2018/0315864 A1* | 11/2018 | Li ........................ H01L 29/93 |
| 2018/0323115 A1* | 11/2018 | Preisler ............. H01L 29/0646 |

OTHER PUBLICATIONS

Sabine, Keith, Product Manager; Pulsic; "Using Deep N Wells in Analog Design"; May 5, 2015; 5 pages.

\* cited by examiner

STRUCTURE FOR IMPROVED NOISE SIGNAL ISOLATION

BACKGROUND

The aggressive scaling of complementary metal-oxide-semiconductor (CMOS) technologies has led to fabrication of semiconductor devices that integrate high-speed digital circuits with high performance analog circuits and radio frequency circuits. In these semiconductor devices, substrate coupling of noise can adversely performance.

CMOS devices are formed from doped semiconductors. During doping, impurity atoms are introduced to an intrinsic semiconductor using a process such as diffusion or ion implantation Impurity atoms are atoms of a different element than the atoms of the intrinsic semiconductor Impurity atoms act as either donors or acceptors to the intrinsic semiconductor, changing the electron and hole concentrations of the semiconductor. A doped semiconductor acts more like a conductor than a semiconductor.

Impurity atoms are classified as either donor or acceptor atoms based on the effect they have on the intrinsic semiconductor. Donor impurity atoms have more valence electrons than the atoms they replace in the intrinsic semiconductor lattice. Donor impurities "donate" their extra valence electrons to a semiconductor's conduction band, providing excess electrons to the intrinsic semiconductor. Excess electrons increase the electron carrier concentration of the semiconductor, making it N type. Acceptor impurity atoms have fewer valence electrons than the atoms they replace in the intrinsic semiconductor. They "accept" electrons from the semiconductor's valence band. This provides excess holes to the intrinsic semiconductor. Excess holes increase the hole carrier concentration of the semiconductor, creating a P type semiconductor. Doping can range from light to heavy. When one dopant atom is added per 100 million atoms, the doping is said to be light. When many more dopant atoms are added, on the order of one per 10,000 atoms, the doping is referred to as heavy. Heavy doping is often indicated by N+ for N type or P+ for P type.

CMOS is a technology for constructing semiconductor devices. The term "complementary" refers to a design style in which complementary pairs of P type and N type metal oxide semiconductor field effect transistors (MOSFETs) are created for use in circuits. As is known in the art, N type MOSFETs (hereinafter "NMOS devices") are typically fabricated in a P substrate. Also, it is common to fabricate P type MOSFETs (hereinafter "PMOS devices") in N wells situated within the same P substrate. The present disclosure will be described with reference to CMOS technology, it being understood the present disclosure should not be limited thereto.

SUMMARY

A structure for improved noise signal isolation in semiconductor devices is described. In one embodiment, the structure includes, a $1^{st}$ first-conductivity type well, a $1^{st}$ first-conductivity type layer, a second-conductivity type substrate and a second-conductivity type layer positioned between the $1^{st}$ first-conductivity type well and the $1^{st}$ first-conductivity type layer. The structure may also include a $2^{nd}$ first-conductivity type well, and a $2^{nd}$ first-conductivity type layer positioned between the $2^{nd}$ first-conductivity type well and the $1^{st}$ first-conductivity type layer. The $1^{st}$ first-conductivity type layer and the second-conductivity type layer are positioned between the second-conductivity type substrate and the $1^{st}$ first-conductivity type well, and the $1^{st}$ first-conductivity type well is laterally separated from the $2^{nd}$ first-conductivity type well. A $1^{st}$ second-conductivity type-first-conductivity type junction capacitance is created at an interface between the $1^{st}$ first-conductivity type well and the second-conductivity type layer. A $2^{nd}$ second-conductivity type-first-conductivity type junction capacitance is created at an interface between the second-conductivity type layer and the $1^{st}$ first-conductivity type layer. A $3^{rd}$ second-conductivity type-first-conductivity type junction capacitance is created at an interface between the $1^{st}$ first-conductivity type layer and the second-conductivity type substrate. The structure is contained in a semiconductor device that includes a $1^{st}$ conductive line for delivering a $1^{st}$ supply voltage to the $1^{st}$ first-conductivity type well, and a $2^{nd}$ conductive line delivering a $2^{nd}$ supply voltage to the $2^{nd}$ first-conductivity type well. The 1st and $2^{nd}$ supply voltages are different in magnitude. The $1^{st}$, $2^{nd}$, and $3^{rd}$ second-conductivity type-first-conductivity type junction capacitances can attenuate noise transmission between the 1st first-conductivity type well and the second-conductivity type substrate. In one embodiment, the first-conductivity type is N type, and the second-conductivity type is P type. In a different embodiment, the first-conductivity type is P type, and the second-conductivity type is N type.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION

Figure 1:
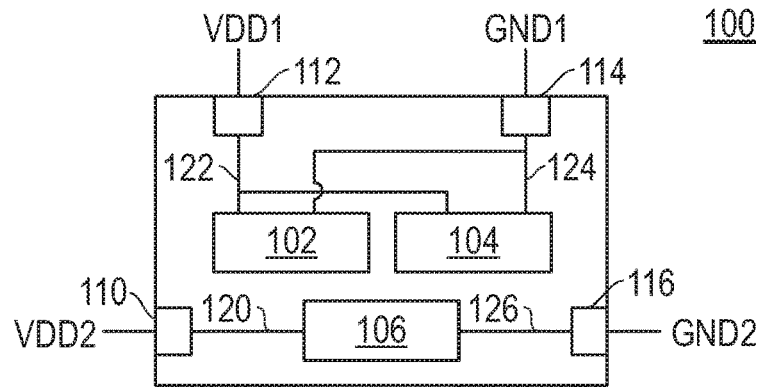
FIG. 1 is a block diagram of a semiconductor device.

Substrate noise coupling is a major problem with CMOS based, high speed, and high performance semiconductor devices. To illustrate FIG. 1 shows a semiconductor device 100 that is fabricated using CMOS technology, and which includes integrated circuits (ICs) 102, 104, and 106. Each IC 102-106 is formed on a common substrate. IC 106 is a type of circuit that is susceptible to noise injected into the common substrate.

Contact pads 110-116 are coupled to conductive lines 120-126, respectively. Supply voltage VDD1 is provided to ICs 102 and 104 via conductive power line 122. Return ground GND is provided to ICs 102 and 104 via conductive ground line 124. Conductive power and ground lines 122 and 124 are formed on the surface of semiconductor device 100. Although not shown semiconductor device 100 is contained within a package that includes bond wires coupled to contact pads 102 and 104, lead frames coupled to the bond wires, etc.

Parasitic resistance and inductance are associated with the contact pads 112 and 144, conductive lines 122 and 124, bond wires, package lead frame, etc. Current flows through these parasitic elements. If the current is constant, the parasitic resistance and inductance would not be much of a concern. However the activity of ICs 102 and 104 can cause rapid changes in the current drawn on power line 122 and subsequently returned on ground line 124. The rapid change of the currents through the parasitic resistance and inductance creates unwanted fluctuation of voltage at the contact points where conductive power and ground lines 120 and 122 provide power and ground to the NMOS and PMOS devices of ICs 102 and/or 104. The unwanted voltage fluctuation on the power line 120 is often referred to as "power bounce noise," while the unwanted voltage fluctuation on the ground lines 122 is often referred to "ground bounce noise." Power bounce noise will be represented herein as VDD1Bz, while ground bounce noise will be represented herein as GND1B. VDD1B and GND1B have low frequency and high frequency components.

Junction capacitance is created at an interface between P and N type regions. The magnitude of this junction capacitance varies with the voltage between the P and N type regions. PMOS devices have some noise isolation between them and their underlying P substrate by virtue of a junction capacitance at the interface between the N wells in which the PMOS devices are situated and the underlying P substrate. This junction capacitance filters or blocks lower frequency components from reaching the P substrate. However, as compared with the PMOS devices, NMOS devices have less noise insulation between them and the substrate when the NMOS devices are situated within, and are not isolated from, the P substrate.

Figure 2:
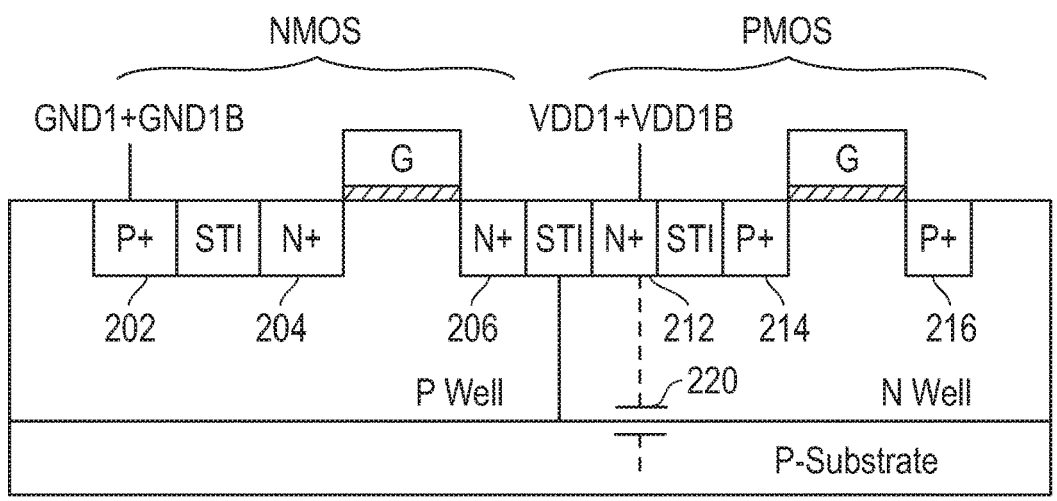
FIG. 2 is a cross-sectional view of an NMOS and PMOS devices employed in the semiconductor device of FIG. 1.

With continuing reference to FIG. 1, FIG. 2 illustrates a cross-sectional view of NMOS and PMOS devices contained within IC 102. The NMOS device includes a body contact 202, source contact 204, and a drain contact 206 formed in a P well. The PMOS device includes a body contact 212, source contact 214 and drain contact 216 formed in an N well. Shallow trench insulators (STIs) separate the various contacts. The P and N wells are formed on a P− substrate as shown. The body contact 202 of the NMOS device is coupled to ground line 124. As a result body contact 202 receives ground bounce noise GND1B. Body contact 212 of the PMOS device is coupled to power line 122. As a result body contact 212 receives power bounce noise VDD1B. Junction capacitance is created at the interface between the N well and the P− substrate. The junction capacitance is represented as capacitor 220 in the FIG. 2. This capacitance has a filter effect on low frequency components of power bounce noise VDD1B injected into the P− substrate via body contact 212. In other words, junction capacitor 220 blocks the low frequency components of VDD1B from reaching the P− substrate. No junction capacitance exists between the P well and the P− substrate. As a result, there is no attenuation of low or high frequency ground bounce noise GND1B, which can travel through the P− substrate and adversely affect operational aspects of IC 106.

Isolation structures can be added to reduce noise transmission between devices and their underlying substrate. Some conventional isolation structures, such as triple well structures, use deep N wells and lateral edge N wells. An example triple well structure includes a P well surrounded by a lateral edge N well and a deep N well, all situated within a P substrate. The lateral edge N well, as its name implies, laterally surrounds the P well and connects with the deep N well, which sits below the P well. The deep N well isolates P well from the P substrate. NMOS devices can be fabricated within isolated P wells, while PMOS devices can be fabricated in isolated N wells.

Figure 3:
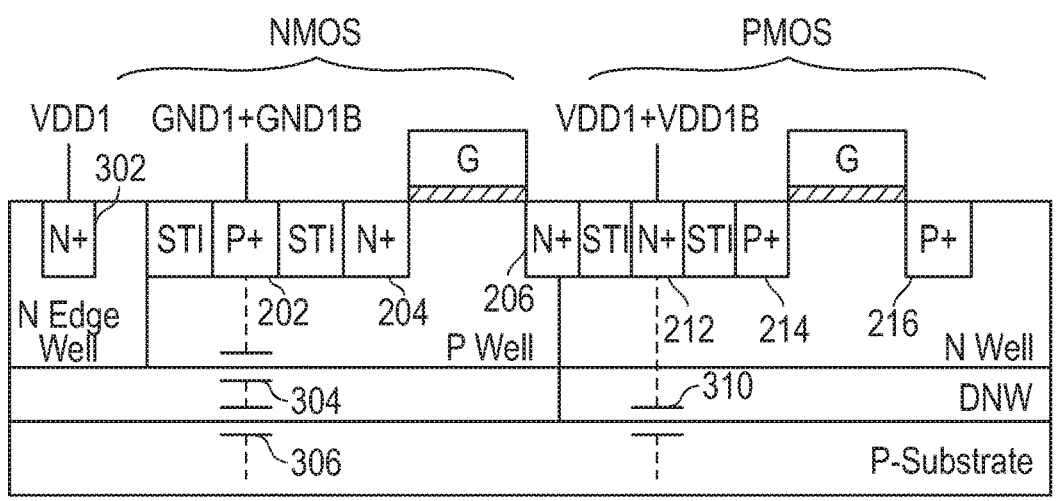
FIG. 3 illustrates the PMOS and NMOS devices of FIG. 2 with an isolation structure added thereto.

FIG. 3 illustrates the NMOS and PMOS devices of FIG. 2 and an isolation structure added thereto. More particular, the isolation structure includes a $1^{st}$ N layer (hereinafter "N edge well") and a $2^{nd}$ N layer (hereinafter "deep N well"). The N edge well includes a contact 302 to that is coupled to the power line 122. As result the N edge well and coupled deep N well (DNW) are biased to VDD1. Junction capacitances are created in series between the body contact 202 of the NMOS device and the P− substrate. In particular, junction capacitances are created at the interfaces between the P well and DNW, and between the DNW and the P− substrate. These junction capacitances are represented in FIG. 3 as capacitors 304 and 306. A junction capacitance is also formed between the body contact 212 and the P− substrate. This junction capacitance is created at the interface between the DNW and the P− substrate and is represented as capacitor 310. It is noted that little or no junction capacitance created between the N well and the DNW. Thus, while a pair of junction capacitors 304 and 306 are coupled in series between body contact 202 and P− substrate, only one junction capacitance 310 is coupled between body contact 212 and the P− substrate. The series combination of junction capacitances 304 and 306 substantially attenuates or blocks low frequency components of ground bounce noise GND1B from reaching the P− substrate. And while the junction capacitors 310 attenuates low frequency components of power bounce noise VDD1B, this attenuation is substantially less the attenuation provided by the series combination of junction capacitors 304 and 306. As a result, and presuming GND1B and VDD1B are equal in magnitude, total bounce noise attenuation is limited to that provided by junction capacitor 310.

Figure 4:
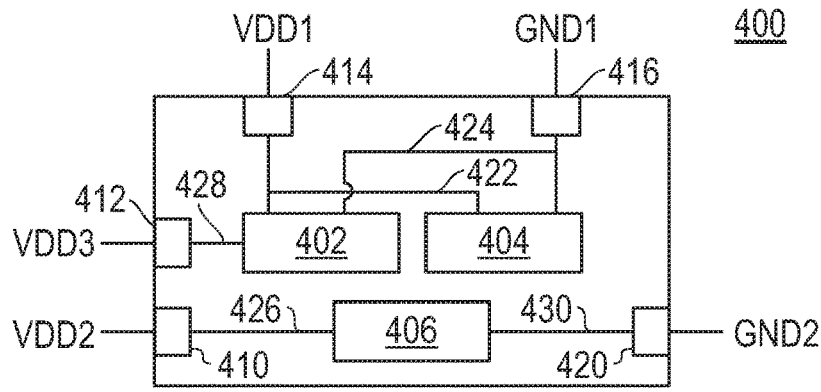
FIG. 4 is a block diagram of a semiconductor device employing one embodiment of the present disclosure.

FIG. 4 illustrates a semiconductor device 400 employing one embodiment of the present disclosure. Semiconductor device 400 is fabricated using CMOS technology and includes integrated circuits (ICs) 402, 404, and 406. Each of the ICs 402-406 is formed on a common substrate. IC 406 is the type of circuit that is susceptible to substrate noise.

Contact pads 410-420 are coupled to conductive lines 422-430 as shown. Contact pads 410-420 and conductive lines 422-430 are formed on the surface of semiconductor device 400. Supply voltage VDD1 is provided to ICs 402 and 404 via power line 422. Another supply voltage VDD3 is provided to IC 402 via power line 128. The magnitudes of VDD1 and VDD3 are different. Return ground GND1 is provided to ICs 402 and 404 via ground line 424. Although not shown semiconductor device 400 is contained within a package that includes bond wires coupled to contact pads 410-420, lead frames coupled to bond wires, etc.

Semiconductor device 400 has the same type of parasitic resistor and inductors as described above with reference to semiconductor device 100. As a result impulse current flow produces power bounce noise VDD1B and ground bounce noise GND1B on lines 422 and 424, respectively. In one embodiment supply voltage VDD3 is provided only to bias isolation structures as will be more fully described below. As a result current flow through line 428 is minimal and substantially constant when compared to the current flow through power line 422. Even though parasitic resistance and inductance exist on power line 428 very little or no power bounce noise exists on line 428.

Figure 5:
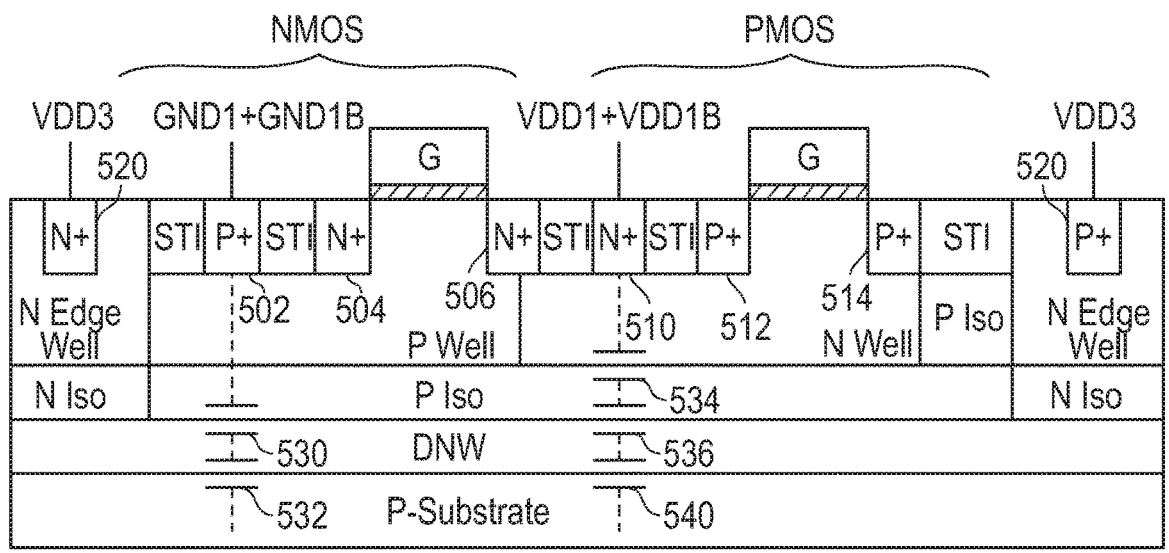
FIG. 5 is a cross-sectional view of an isolation structure employing one embodiment of the present disclosure.

With continuing reference to FIG. 4, FIG. 5 illustrates a cross-sectional view NMOS and PMOS devices contained within IC 402. The NMOS device includes a body contact 502, source contact 504, and a drain contact 506 formed in a P well. The PMOS device includes a body contact 510, source contact 512 and drain contact 514 formed in an N well. STIs separate the various contacts. The body contact 502 of the NMOS device is coupled to the ground line 424. As a result body the P well receives ground bounce noise GND1B. Body contact 510 of the PMOS device is coupled to the power line 424. As a result the N well power bounce noise VDD1B.

FIG. 5 also includes an isolation structure, which can block a substantial amount of bounce noise from reaching the P− substrate. This isolation structure includes a $1^{st}$ N layer (i.e., N edge well) coupled to a 2nd N layer (i.e., deep N well or DNW) via a 3rd N layer (i.e., N Iso). The N edge well includes contacts 520 coupled to the power line 428. As result the N edge well, N Iso and DNW are biased to VDD3. The isolation structure also includes a $1^{st}$ P layer (P− Iso) laterally positioned between the N Iso layer as shown. P− Iso is also positioned between the DNW and the device wells (i.e., P and N wells). A 2nd P layer (P Iso) decouples the N well from the N edge well, which are biased to different voltages VDD1 and VDD3 as more fully described below.

Junction capacitances are created in the isolation structure of FIG. 5. In particular, junction capacitances are created in series between and NMOS body contact 502 and P− substrate. These junction capacitances are represented in FIG. 5 as capacitors 530 and 532. Junction capacitances are also created in series between body contact 510 of the PMOS device and the P− substrate. These junction capacitances are represented as capacitors 534-540 as shown in FIG. 5.

FIGS. 3 and 5 show the junction capacitors provided by the isolation structures. The isolation structure in FIG. 3 provides two junction capacitors 304 and 306 in series between body contact 202 and the P− substrate. The isolation structure of FIG. 5 also shows a pair of junction capacitors 530 and 532 in series between body contact 502 and the P− substrate. Presuming these junction capacitors have the same capacitance, and presuming ground bounce noise GND1B is equal at body contacts 202 and 502, the isolation structures of FIGS. 3 and 5 are substantially equal in their ability to attenuate low frequency components of GND1B. However, FIGS. 3 and 5 show a substantial difference in the number of junction capacitors between the P− substrate and body contacts 212 and 510. FIG. 3 shows a single junction capacitor 310 between body contact 212 and P− substrate, while FIG. 5 shows 3 junction capacitors 534-540 between body contact 510 and the P− substrate. Presuming these junction capacitors have the same capacitance, the total capacitance between body contact 510 and the P− substrate is less than the capacitance between body contact 212 and P− substrate. As a result, the series connection of junction capacitors 534-540 is more effective at attenuating low frequency components of VDD1B then junction capacitor 310. Ultimately, this means the isolation structure of FIG. 5 is more effective at attenuating total bounce noise (i.e. VDD1B+GND1B). The inventors listed above implemented a computer simulation of the isolation structures shown within FIGS. 3 and 5. The simulation showed the isolation structure of FIG. 3 provides an average response of −20 dB/decade for lower frequency noise. In contrast the computer simulation for the isolation structure shown in FIG. 5 provides an average response of −40 dB/decade for the same lower frequency noise.

Figure 6:
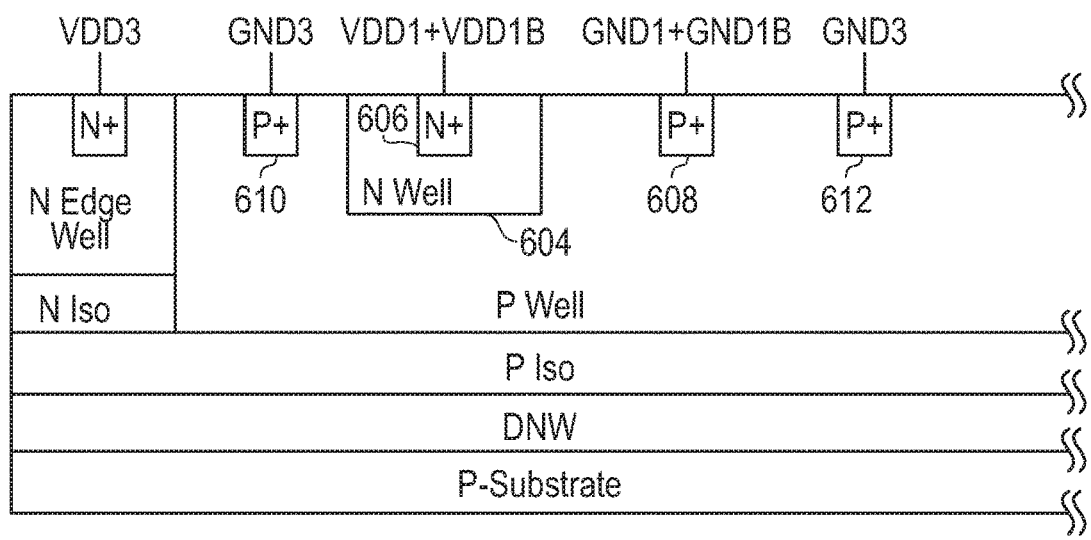
FIG. 6 is a cross-sectional view of an additional isolation instruction structure that could be employed in the semiconductor device of FIG. 4.

FIG. 6 illustrates a cross-sectional view of an additional isolation structure that could be included in devices of IC 406. The additional isolation structure shown in FIG. 6 includes many of the components shown in FIG. 5. For example, FIG. 6 includes the N Iso coupled between the N edge well and DNW. FIG. 6 also shows the P− Iso positioned between the DNW and the P− substrate. As in FIG. 5, contact 602 is coupled to receive supply voltage VDD3.

In contrast to FIG. 5 an N well 604 is disposed within the P well of FIG. 6. PMOS devices can be formed within N well 604. The P well also includes contacts 610 and 612, which are connected to an external ground GND3 via a ground line, contact pad, bond wire, lead frame, etc. (not shown). In one embodiment, ground GND3 is provided only to contacts 610 and 612 and similarly situated contacts in devices of IC 402. As a result, little no ground bounce noise is present at contacts 610 and 612. For the purposes of explanation it will be presumed no ground bounce noise exists at contacts 610 and 612. A junction capacitance is created between contact 606 and contact 610 at the interface between N well 604 and the P well. This junction capacitance serves to attenuate high frequency components of power line bounce noise VDD1B. A resistive connection is created between contact 612 and body contact 608, which in turn is coupled to the ground line 424. This resistive contact shorts the ground bounce noise GND1B received at body contact 608.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:
   a $1^{st}$ first-conductivity type well;
   a second-conductivity type substrate;
   a $1^{st}$ first-conductivity type layer;
   a second-conductivity type layer positioned between the $1^{st}$ first-conductivity type well and the $1^{st}$ first-conductivity type layer;
   a $2^{nd}$ first-conductivity type well coupled to the $1^{st}$ first-conductivity type layer;
   wherein the $1^{st}$ first-conductivity type layer and the second-conductivity type layer are positioned between the second-conductivity type substrate and the $1^{st}$ first-conductivity type well;
   wherein the $1^{st}$ first-conductivity type well is laterally separated from the $2^{nd}$ first-conductivity type well;
   a 2nd first-conductivity type layer,
   wherein the 2nd first-conductivity type layer is positioned between the 2nd first-conductivity type well and the 1st first-conductivity type layer, and
   wherein the 1st first-conductivity type layer, 2nd first-conductivity type layer, and 2nd first-conductivity type well are electrically coupled together to be at a common voltage.

2. The apparatus of claim 1 further comprising:
   a second-conductivity type well is laterally adjacent to the $1^{st}$ first-conductivity type well;
   wherein the second-conductivity type layer and the $1^{st}$ first-conductivity type layer are positioned between the second-conductivity type substrate and the second-conductivity type well.

3. The apparatus of claim 1 further comprising:
   wherein the $1^{st}$ first-conductivity type layer and the second-conductivity type substrate are configured to create a $1^{st}$ junction capacitance therebetween;
   wherein the $1^{st}$ first-conductivity type layer and the second-conductivity type layer are configured to create a $2^{nd}$ junction capacitance therebetween;
   wherein the $1^{st}$ first-conductivity type well and the second-conductivity type layer are configured to create a $3^{rd}$ junction capacitance therebetween.

4. The apparatus of claim 1 further comprising:
   a $1^{st}$ first-conductivity type contact in the $1^{st}$ first-conductivity type well;
   a $2^{nd}$ first-conductivity type contact in the $2^{nd}$ first-conductivity type well;
   a $1^{st}$ second-conductivity type contact in the second-conductivity type well;
   a $1^{st}$ integrated circuit comprising a plurality of transistors;
   a $1^{st}$ supply voltage conductor configured to provide a $1^{st}$ supply voltage to the $1^{st}$ integrated circuit and to the $1^{st}$ second-conductivity type contact;
   a $1^{st}$ ground conductor configured to provide a $1^{st}$ ground to the $1^{st}$ integrated circuit and the $2^{nd}$ first-conductivity type contact;
   a $2^{nd}$ supply voltage conductor configured to provide a $2^{nd}$ supply voltage to the $2^{nd}$ first-conductivity type contact;
   wherein magnitudes of the $1^{st}$ and $2^{nd}$ voltages are different from each other.

5. The apparatus of claim 4 wherein the 2nd supply voltage conductor does not provide the 2nd supply voltage to the 1st integrated circuit.

6. The apparatus of claim 5 further comprising:
   a $2^{nd}$ second-conductivity type contact in the second-conductivity type well;
   a $2^{nd}$ ground conductor configured to provide a $2^{nd}$ ground to the $2^{nd}$ second-conductivity type contact;
   wherein the $2^{nd}$ ground conductor does not provide the $2^{nd}$ ground to the $1^{st}$ integrated circuit.

7. The apparatus of claim 6 further comprising:
   a $3^{rd}$ first-conductivity type well contained within the second-conductivity type well;
   a $3^{rd}$ first-conductivity type contact in the $3^{rd}$ first-conductivity type well;
   wherein the $2^{nd}$ supply voltage conductor is configured to provide the $2^{nd}$ supply voltage to the $3^{rd}$ first-conductivity type contact.

8. The apparatus of claim 4 wherein the 1st first-conductivity type layer, 2nd first-conductivity type layer, and 2nd first-conductivity type well are coupled together and maintained at the 1st supply voltage when the 1st supply voltage conductive line is coupled to the 1st supply voltage, and wherein the 1st first-conductivity type well is maintained at the 2nd supply voltage when the 2nd supply voltage is connected to the 2nd supply voltage conductor.

9. The apparatus of claim 4:
   wherein the electron concentration within the $1^{st}$ first-conductivity type contact is greater than the electron concentration in the $1^{st}$ first-conductivity type well;
   wherein the hole concentration of the $1^{st}$ type contact is greater than the hole concentration in the second-conductivity type well.

10. A method for making a semiconductor die comprising a plurality of integrated circuits, said method comprising:
    forming a $1^{st}$ first-conductivity type layer on a second-conductivity type substrate, wherein the $1^{st}$ first-conductivity type layer and second-conductivity type substrate are configured to create a $1^{st}$ junction capacitance therebetween;
    forming a second-conductivity type layer on the $1^{st}$ first-conductivity type layer, wherein the second-conductivity type layer and $1^{st}$ first-conductivity type layer are configured to create a $2^{nd}$ junction capacitance therebetween;
    forming a $2^{nd}$ first-conductivity type layer on the $1^{st}$ first-conductivity type layer;
    forming $1^{st}$ and $2^{nd}$ first-conductivity type wells after formation of the $2^{nd}$ first-conductivity type layer;
    wherein the $1^{st}$ first-conductivity type well and the second-conductivity type layer are configured to create a $3^{rd}$ junction capacitance therebetween;
    wherein the $2^{nd}$ first-conductivity type well is formed on the $2^{nd}$ first-conductivity type layer.

11. The method of claim 10 further comprising:
    forming a second-conductivity type well on the second-conductivity type layer;
    wherein the $1^{st}$ and $2^{nd}$ first-conductivity type wells are formed at the same time, but are laterally separated by the second-conductivity type well.

12. The method of claim 11 wherein the second-conductivity type layer has a lower hole concentration then the hole concentration of the second-conductivity type well.

13. The method of claim 11 further comprising:
    forming $1^{st}$ and $2^{nd}$ first-conductivity type contacts in the $1^{st}$ and $2^{nd}$ first-conductivity type wells, respectively;
    forming a $1^{st}$ second-conductivity type contact in the second-conductivity type well;
    forming a $1^{st}$ integrated circuit of the plurality of integrated circuits on the second-conductivity type substrate;
    after formation of the $1^{st}$ and $2^{nd}$ first-conductivity type contacts, the $1^{st}$ second-conductivity type contact, and the 1$^{st}$ integrated circuit, forming a 1$^{st}$ supply voltage conductor, a 2$^{nd}$ supply voltage conductor, and a 1$^{st}$ ground conductor;

wherein the 1$^{st}$ supply voltage conductor is configured to provide a 1$^{st}$ supply voltage to the 1$^{st}$ integrated circuit and the 1$^{st}$ second-conductivity type contact;

wherein the 2$^{nd}$ supply voltage conductor is configured to apply provide the 2$^{nd}$ supply voltage to the 2$^{nd}$ first-conductivity type contact, but not the 1$^{st}$ integrated circuit;

wherein the 1$^{st}$ ground conductor is configured to provide a 1$^{st}$ ground to the 1$^{st}$ integrated circuits and the 2$^{nd}$ first-conductivity type contact.

14. The method of claim 13:

wherein the 1$^{st}$ and 2$^{nd}$ first-conductivity type layers are electrically coupled together, but lack a junction capacitance therebetween;

wherein the 2$^{nd}$ first-conductivity type well and 2$^{nd}$ first-conductivity type layer are electrically coupled together, but lack a junction capacitance therebetween.

15. The method of claim 14 further comprising:

forming a 2$^{nd}$ second-conductivity type contact in the second-conductivity type well;

forming a 2$^{nd}$ ground conductor configured to provide a 2$^{nd}$ ground to the 2$^{nd}$ second-conductivity type contact;

wherein the 2$^{nd}$ ground conductor does not provide the 2$^{nd}$ ground to the 1$^{st}$ integrated circuit.

16. Method of claim 15 further comprising:

forming a 3$^{rd}$ first-conductivity type well in the second-conductivity type well;

forming a 3$^{rd}$ first-conductivity type contact in the 3$^{rd}$ first-conductivity type well; wherein the 2$^{nd}$ voltage supply conductor is configured to provide a 2$^{nd}$ voltage supply to the 3$^{rd}$ first-conductivity type contact.

17. A method of claim 10 further comprising:

forming a 2$^{nd}$ integrated circuit on the second-conductivity type substrate; wherein the 1$^{st}$ first-conductivity type well is a component of the 2$^{nd}$ integrated circuit;

wherein the 1$^{st}$ and 2$^{nd}$ integrated circuits perform distinct functions.

18. An apparatus comprising:

a 1$^{st}$ integrated circuit; wherein the 1$^{st}$ integrated circuit comprises:

a 1$^{st}$ first-conductivity type layer formed on a second-conductivity type substrate, wherein the 1$^{st}$ first-conductivity type layer and second-conductivity type substrate are configured to create a 1$^{st}$ junction capacitance therebetween;

a second-conductivity type layer formed on the 1$^{st}$ first-conductivity type layer, wherein the second-conductivity type layer and 1$^{st}$ first-conductivity type layer are configured to create a 2$^{nd}$ junction capacitance therebetween;

a 2$^{nd}$ first-conductivity type layer formed on the 1$^{st}$ first-conductivity type layer;

1$^{st}$ and 2$^{nd}$ first-conductivity type wells;

wherein the 1$^{st}$ first-conductivity type well and the second-conductivity type layer are configured to create a 3$^{rd}$ junction capacitance therebetween;

wherein the 2$^{nd}$ first-conductivity type well is formed on the 2$^{nd}$ first-conductivity type layer.

19. The apparatus of claim 18 further comprising:

a 2$^{nd}$ integrated circuit formed on the second-conductivity type substrate;

a 1$^{st}$ voltage supply conductor configured to provide a 1$^{st}$ voltage supply to the 1$^{st}$ and 2$^{nd}$ integrated circuits;

a 1$^{st}$ ground conductor configured to provide a 1$^{st}$ ground to the 1$^{st}$ and 2$^{nd}$ integrated circuits;

a 2$^{nd}$ voltage supply conductor configured to provide a 2$^{nd}$ voltage supply to the 1$^{st}$ integrated circuits, but not the 2$^{nd}$ integrated circuit.

* * * * *